United States Patent [19]

Yano

[11] Patent Number: 5,132,748

[45] Date of Patent: Jul. 21, 1992

[54] SEMICONDUCTOR MEMORY DEVICE

[75] Inventor: Kohsaku Yano, Osaka, Japan

[73] Assignee: Matsushita Electric Industrial Co., Ltd., Osaka, Japan

[21] Appl. No.: 682,109

[22] Filed: Apr. 8, 1991

[30] Foreign Application Priority Data

Apr. 6, 1990 [JP] Japan .................. 2-92405

[51] Int. Cl.$^5$ .................. H01L 29/48; H01L 29/56; H01L 29/64
[52] U.S. Cl. .................. 357/15; 357/22; 357/34; 357/43; 357/45
[58] Field of Search .................. 357/22 D, 34, 43, 15, 357/45, 22 C, 22 F, 22 G

[56] References Cited

U.S. PATENT DOCUMENTS

| | | | |
|---|---|---|---|
| 4,434,433 | 2/1984 | Vishizawa | 357/41 |
| 4,488,350 | 12/1984 | Vora et al. | 357/34 |
| 4,656,495 | 4/1987 | Birrittella | 357/34 |
| 4,903,087 | 2/1990 | Jerome et al. | 357/34 |
| 4,956,688 | 9/1990 | Honma et al. | 357/36 |

Primary Examiner—Andrew J. James
Assistant Examiner—Sara W. Crane
Attorney, Agent, or Firm—Wenderoth, Lind & Ponack

[57] ABSTRACT

A semiconductor device includes a first semiconductor region connected to a bit line for controlling signal charges; a second semiconductor region connected to the first semiconductor region and to a word line for controlling signal charges, wherein the second semiconductor region has a type of electrical conductivity which is different from that of the first semiconductor region; and a third semiconductor region connected to the second semiconductor region and to a data line for reading the signal charges, wherein the third semiconductor region has a type of electrical conductivity which is the same as that of the first semiconductor region, and wherein the third semiconductor region has a barrier at the interface with the data line, the barrier being able to be controlled by the bit line and the word line to store signal charges in the third semiconductor regions. The barrier may be a Schottky barrier or a thin insulating film which can be controlled by the bit and word lines for writing, holding and reading of information charges in the third semiconductor region. A fourth semiconductor region may be arranged between the first and the third semiconductor regions in parallel to the second region as in a junction field effect transistor.

14 Claims, 14 Drawing Sheets

⇨ flow of electrons
⇨ flow of holes

⇨ flow of electrons

ced by a sense amplifier A for
SEMICONDUCTOR MEMORY DEVICE

BACKGROUND OF THE INVENTION

1. Field of the Invention

The present invention relates to a semiconductor device having a memory function.

2. Description of Related Art

Figure 1:
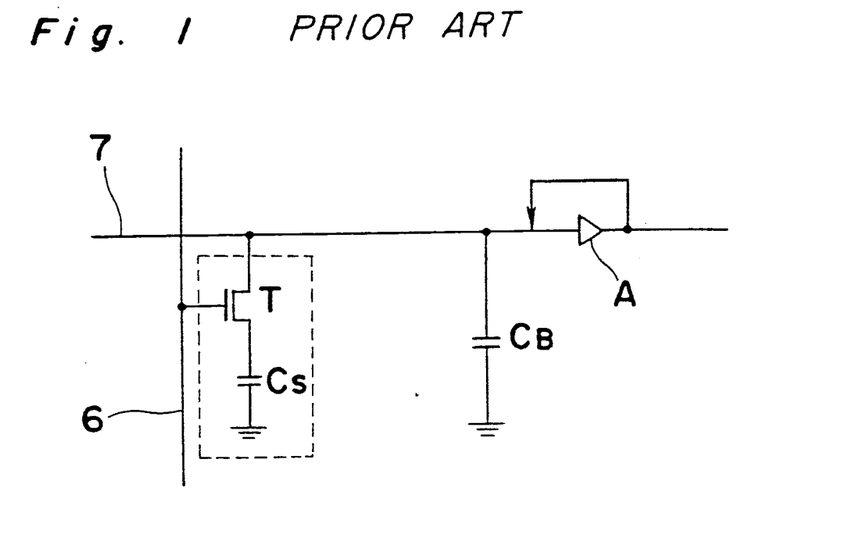
FIG. 1 is a diagram of equivalent circuit of a prior art memory cell.

An equivalent circuit of a bit (hereinafter referred to as cell) of a dynamic random access memory (hereinafter referred to as a DRAM) of an LSI consists of a transistor T and a capacitor $C_s$, as shown in FIG. 1. The capacitor $C_s$ is connected to the source electrode of the transistor T, while the drain electrode of the transistor T is connected to a data line and the gate electrode is connected to a word line. Information is stored as a "1" (high level) or a "0" (low level) according to whether or not the capacitor $C_s$ has a charge stored therein.

When the information is read, the word line is changed to a high level, and the transistor T is turned on. Then, the charge $Q_s$ stored in the capacitor $C_s$ flows through the transistor T to the data line, and the charge $Q_s$ of the memory cell and the charge stored in the data line capacitor $C_B$ are redistributed to change the electrical potential of the data line. This change in the electrical potential is amplified by a sense amplifier A for providing an output. At this time, the charge $Q_s$ stored in the capacitor $C_s$ vanishes. Therefore, the information must be restored by feeding back the amplified signal from the sense amplifier A to the data line in order to a again write in the memory cell.

Figure 2:
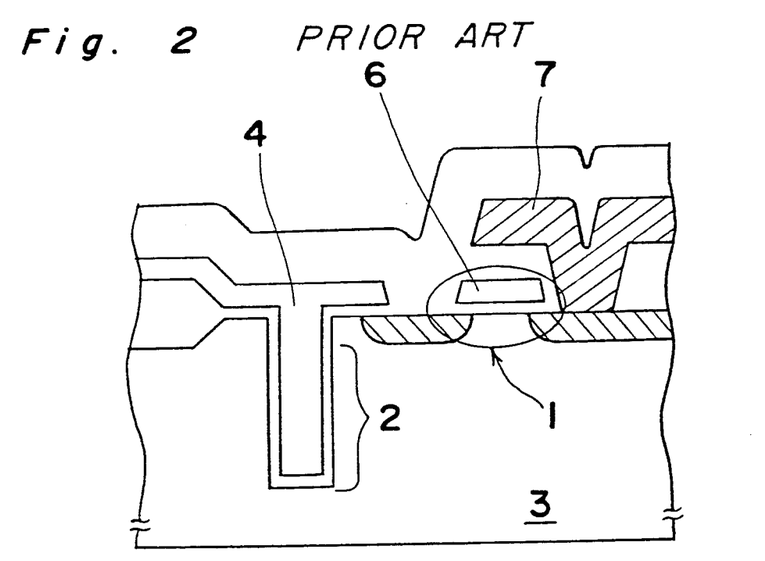
FIG. 2 is a schematic sectional view of a prior art memory cell.
Figure 3:
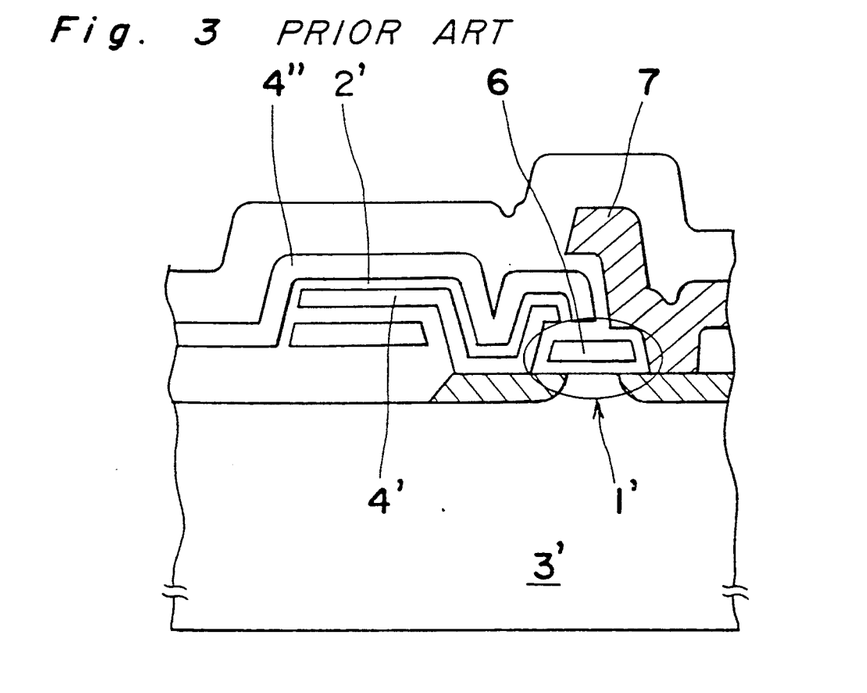
FIG. 3 is a schematic sectional view of another prior art memory cell.

FIGS. 2 and 3 show examples of sectional views of memory cells. In a trench type memory cell shown in FIG. 2, a capacitor part 2 of memory cell to be connected to a switching transistor part 1 is dug deep into the substrate 3, and a charge is stored between the substrate 3 and an electrode 4. In a stack type memory cell shown in FIG. 3, a transistor part 1' of memory cell is formed on a substrate 3', while a capacitor part is stacked above the transistor part 1'. The capacitor part 2' consists of two electrodes 4 and 4'.

Figure 4:
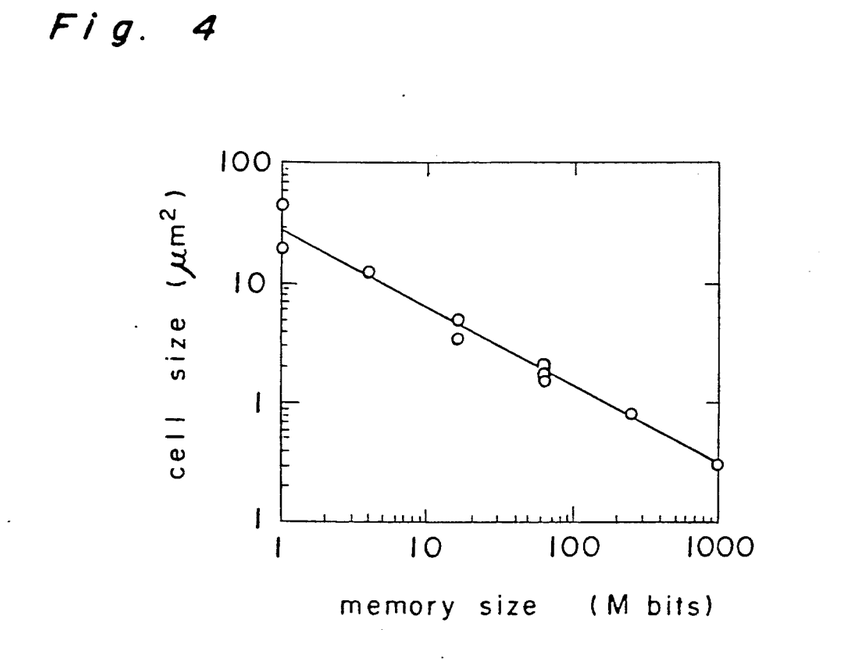
FIG. 4 is a graph of cell size plotted against memory size.

In such DRAMs as explained above, as shown in FIG. 4, the cell size of 256M bit memory is about 0.8 $\mu m^2$ and that of 1 G bit memory is about 0.3 $\mu m^2$ if extrapolated from the cell sizes of 1M, 4M, 16M bit memories. If the cell size becomes very small as estimated above, the areas of the source and drain electrodes to be connected to the capacitor part or the metallizations is as small as 0.1 $\mu m^2$ by assuming that a MOS transistor used for a DRAM consists essentially of a source, a drain and a gate electrodes and that the cell area is simply divided into three. Thus, the size for forming metallizations becomes extremely small.

Figure 5:
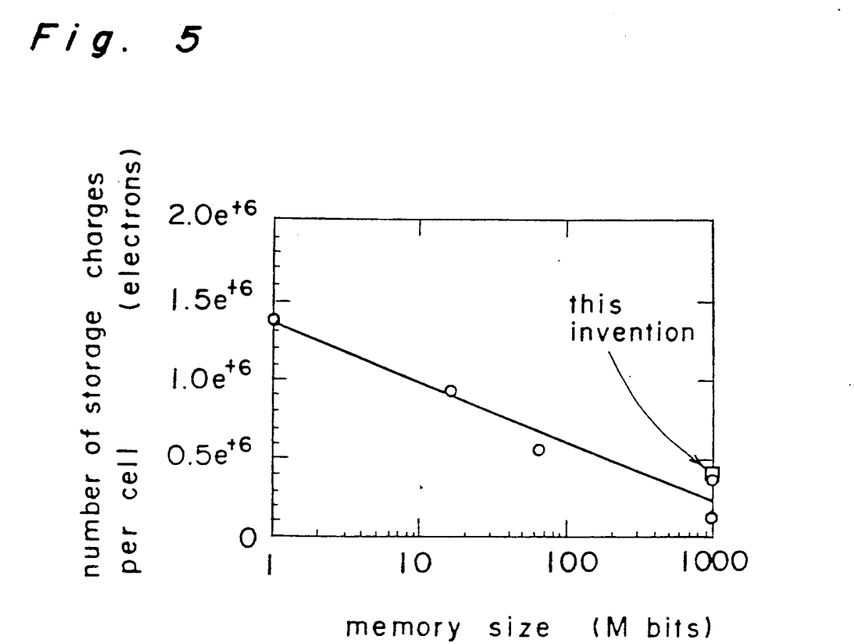
FIG. 5 is a graph of the number of storage charges per memory cell plotted against memory size.
Figure 6:
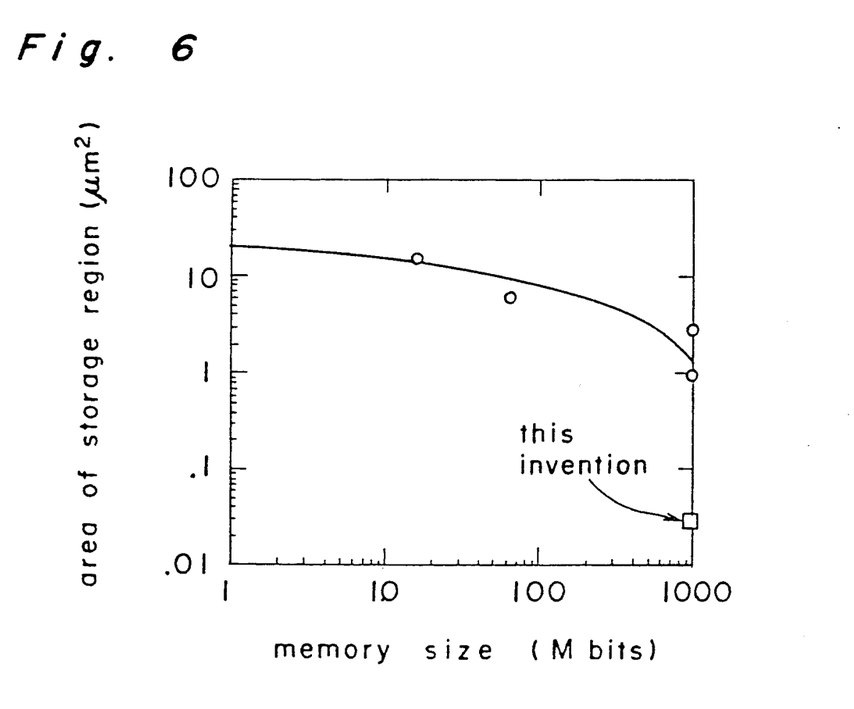
FIG. 6 is a graph of the area of storage region plotted against memory size.

Further, as shown in FIG. 5, charges of about $3\times 10^5$ electrons for storage is needed per cell by using a similar extrapolation. As shown in FIG. 6, the area of charge storage region for a capacitor in a 1 G bit DRAM is about 1-3 $\mu m^2$ by assuming that the thickness of a capacitor insulating film in a capacitor part is 5 nm of $SiO_2$. Then, the area of a charge storage region is expected to be three to ten times that of a cell. This means that a very deep trench is needed for a trench type DRAM, while a very highly stacked capacitor is needed for a stack type DRAM. Therefore, it is very difficult to realize a DRAM of 256M or more.

SUMMARY OF THE INVENTION

It is an object of the present invention to provide a semiconductor device having memory cells at a high density by using a metallization of not so small size.

A semiconductor device according to the present invention comprises a first semiconductor region connected to a bit line for supplying signal charges; a second semiconductor region connected to the first semiconductor region to form a pn junction and to a word line for controlling the signal charges, wherein the second semiconductor region has a type of electrical conductivity different from that of the first semiconductor region; and a third semiconductor region connected to the second semiconductor region to form a pn junction and to a data line for reading the signal charges, wherein said height of said barrier is controlled by voltages applied by said bit and word lines and said signal charges are stored in said third semiconductor area or said signal charges stored in said third semiconductor region are transferred to said data line according to said height of said barrier The barrier may be a Schottky barrier or a thin insulating film which can be controlled by the bit and word lines for writing, holding and reading of signal charges stored in the third semiconductor region.

A fourth semiconductor region may be arranged between the first and the third semiconductor regions in parallel to the second semiconductor region, as in a junction field effect transistor.

It is an advantage of the present invention that the size of charge storage region can be decreased while parts such as metallization can have enough space in a semiconductor device having memory cells at a high density.

BRIEF DESCRIPTION OF THE DRAWINGS

Further objects and advantages of the present invention will be apparent in the detailed explanation of the embodiments of the present invention with reference to the drawings, wherein:

FIG. 12(a)-(n) are schematic sectional views for showing successively the process for manufacturing a semiconductor device shown in FIG. 7;

FIGS. 14(a)-(j) are schematic sectional views for showing successively the process of another method for manufacturing a semiconductor device shown in FIG. 7;

FIGS. 18(a)-(c) are schematic diagrams of a band structure of a cell shown in FIG. 17 for explaining writing, holding and reading of the memory function, respectively;

FIGS. 20(a)-(c) are diagrams for explaining writing, holding and reading of the memory function, respectively.

DETAILED DESCRIPTION OF THE PREFERRED EMBODIMENT

Embodiments of the present invention will be explained below with reference to the drawings wherein the same numerals designate the same or similar elements.

EXAMPLE 1

Figure 7:
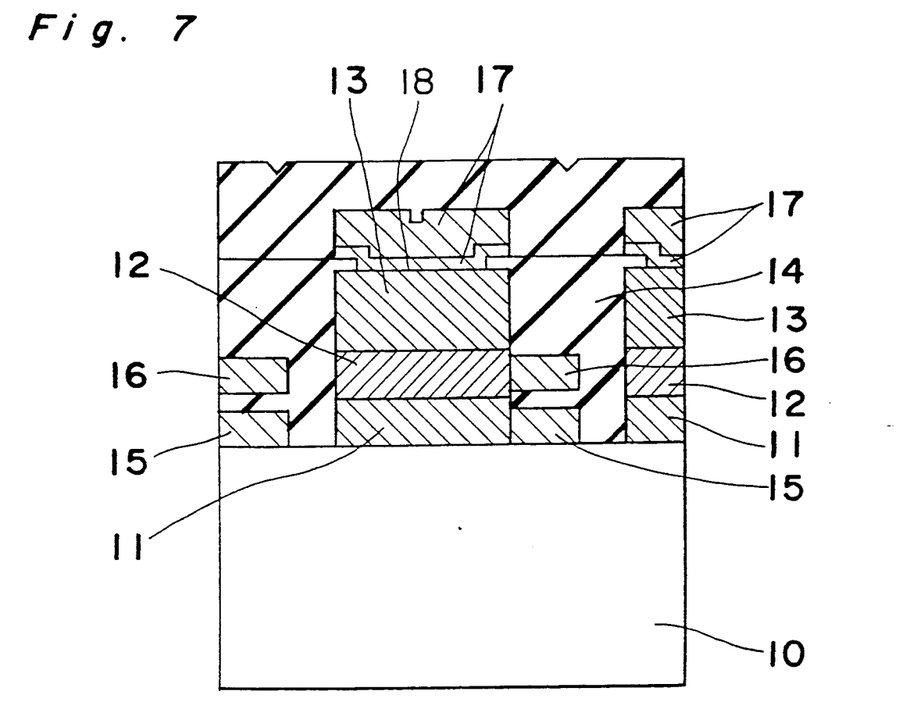
FIG. 7 is a schematic sectional view of a cell of a semiconductor device.

FIG. 7 shows a schematic sectional view of a cell of a semiconductor device having a memory function, wherein a first n-type semiconductor region 11, a p-type semiconductor region 12 and a second n-type semiconductor region 13 are formed successively on a semiconductor substrate 10. A cell includes a unit of these regions 11, 12 and 13, and the cells are separated from each other by an insulating film 14. The first n-type semiconductor region 11 and the p-type semiconductor region 12 are connected to a bit line 15 for writing information and to a word line 16 for supplying signal charges, respectively, while the third semiconductor region 13 is connected through a Schottky contact interface 18 to a data line 17 for reading information.

Figure 8:
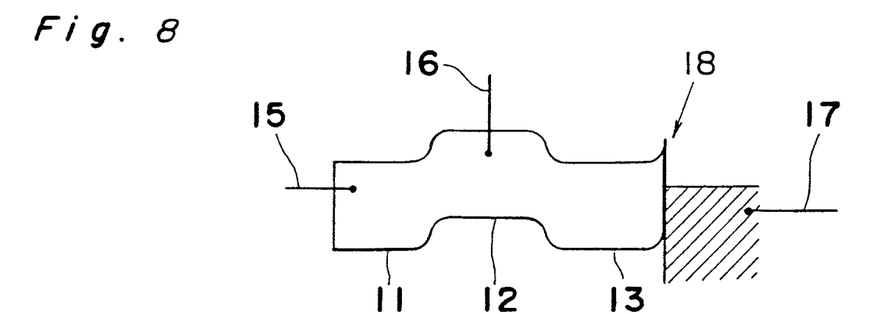
FIG. 8 is a schematic diagram of band structure of a cell shown in FIG. 7.

FIG. 8 shows a schematic diagram of a band structure of a cell of the semiconductor device shown in FIG. 7 including the first and second n-type semiconductor regions 11 and 13 and the p-type semiconductor region 12 interposed between them. The three semiconductor regions 11, 12 and 13 are applied successively via pn junctions, while the second n-type semiconductor region 13 is connected to the data line 17 via a Schottky contact interface 18. As will be explained below, signal charges are stored in the second n-type semiconductor region 13 or between the pn junction with the p-type semiconductor region 12 and the Schottky junction at the interface 18.

The flow of signal charges in a cell shown in FIGS. 9(a)-(c) will be explained as to the memory functions of writing, storing and reading, respectively, of the semiconductor device shown in FIG. 7. FIGS. 10(a)-(c) show the band diagrams corresponding to the three memory functions wherein dots designate electrons schematically.

Figure 9A:
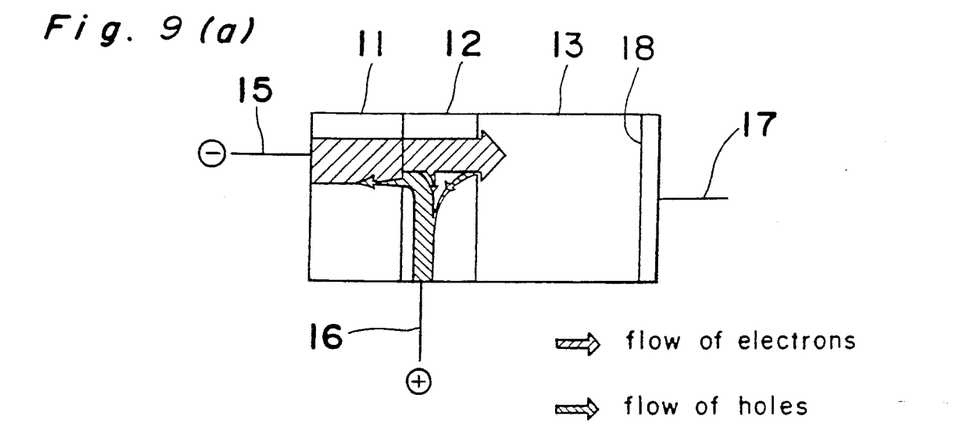
FIGS. 9(a), (b) and (c) are diagrams for explaining writing, holding and reading of the memory function, respectively.
Figure 10A:
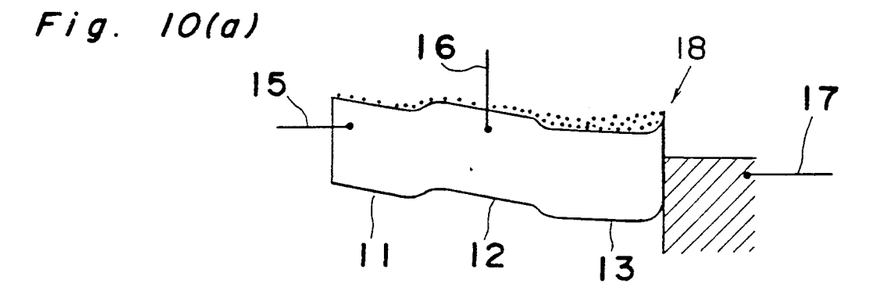
FIGS. 10(a), (b) and (c) are schematic diagrams of a band structure of a cell shown in FIG. 7 for explaining writing, holding and reading of the memory function, respectively.
Figure 10B:
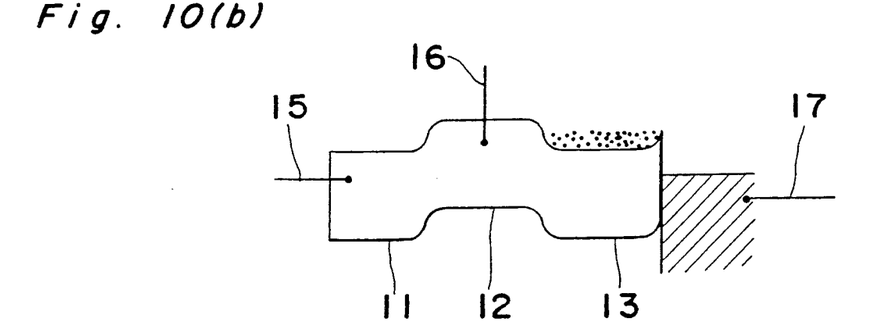
Figure 10C:
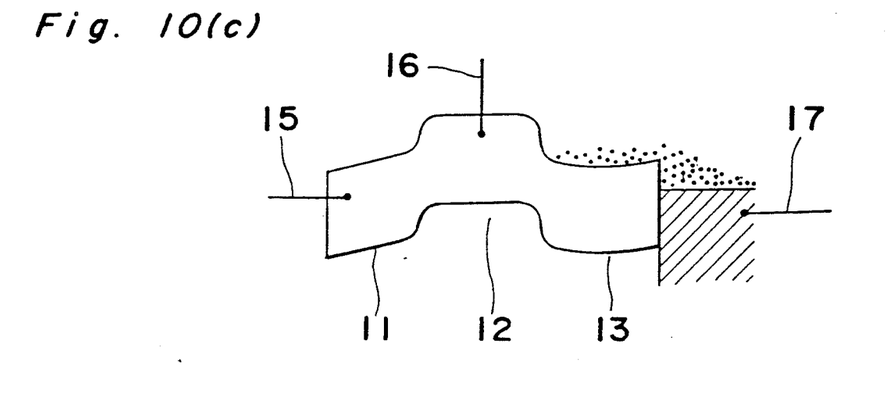

FIG. 9(a) shows the flow of charges in the state of writing wherein a negative electrical voltage and a positive electrical voltage are applied to the bit line 15 and to the word line 16, respectively. Electrons (signal charges) are injected from the bit line 15 to the first n-type semiconductor region 11 and flow into the second n-type one 13 while re-combining partly with holes injected from the word line 16 to the p-type semiconductor region 12. Thus, as shown in FIG. 10(a), information electrons move from the first n-type semiconductor region 11 to the second n-type semiconductor region 13.

The information electrons are prevented from flowing into the data line 17 because of the existence of the Schottky barrier interface 18.

Figure 9B:
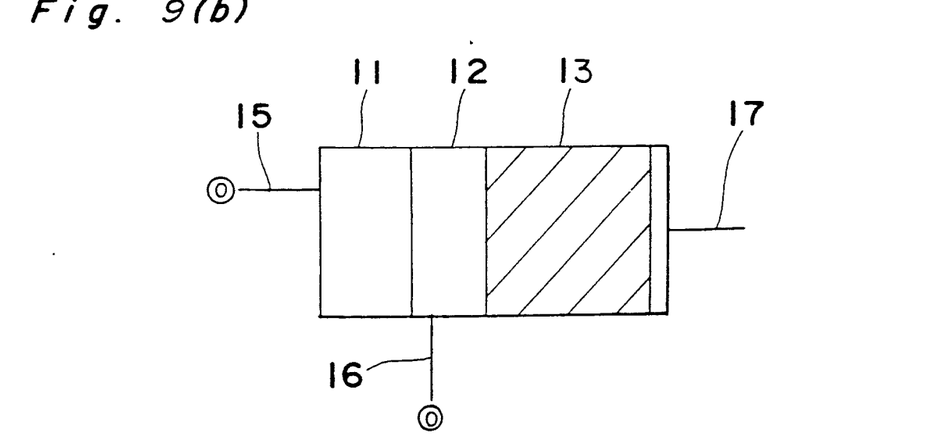

In order to hold the charges, as shown in FIG. 9(b), the electrical voltages applied to the bit and word lines 15, 16 are changed to zero. Then, the information electrons flowing into the second n-type semiconductor region 13 are kept between the pn junction between the p-type and the second n-type semiconductor regions 12 and 13 and the Schottky contact interface 18 between the second n-type semiconductor region 13 and the data line 17. The band diagram in this state is shown in FIG. 10(b).

Figure 9C:
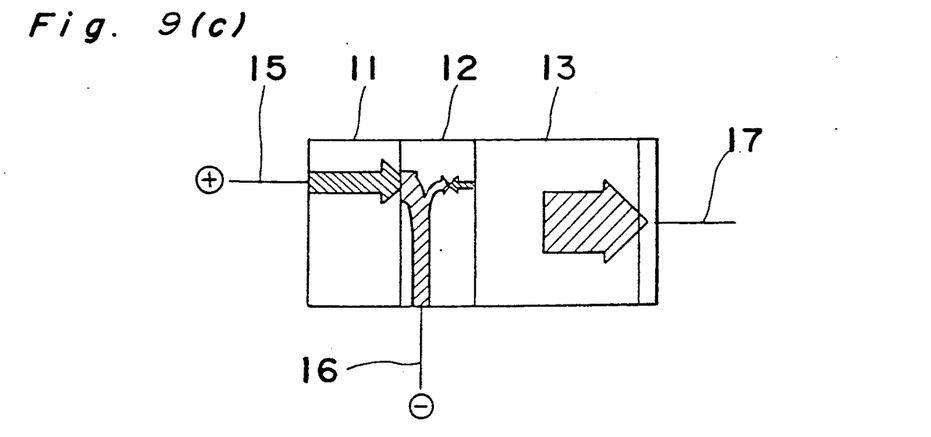

In order to read information, as shown in FIG. 9(c), the electrical voltage of the bit line 15 is made positive, while that of the word line 16 is made negative. By making the electrical voltage of the word line 16 negative, electrons are injected slightly from the word line 16 into the p-type semiconductor region 12. However, most of them are re-combined with holes injected from the bit line 15 while the remaining electrons are re-combined with holes from the second n-type semiconductor region 13. Thus, the electrons from the word line 16 do not affect the information read through the data line 17. On the other hand, the electrons stored in the second n-type information region 13 flow through the Schottkey barrier interface 18 to the data line 17, as shown in FIG. 10(c). As explained above, information charges flow into a cell from one side and flow out to the other side.

Figure 11:
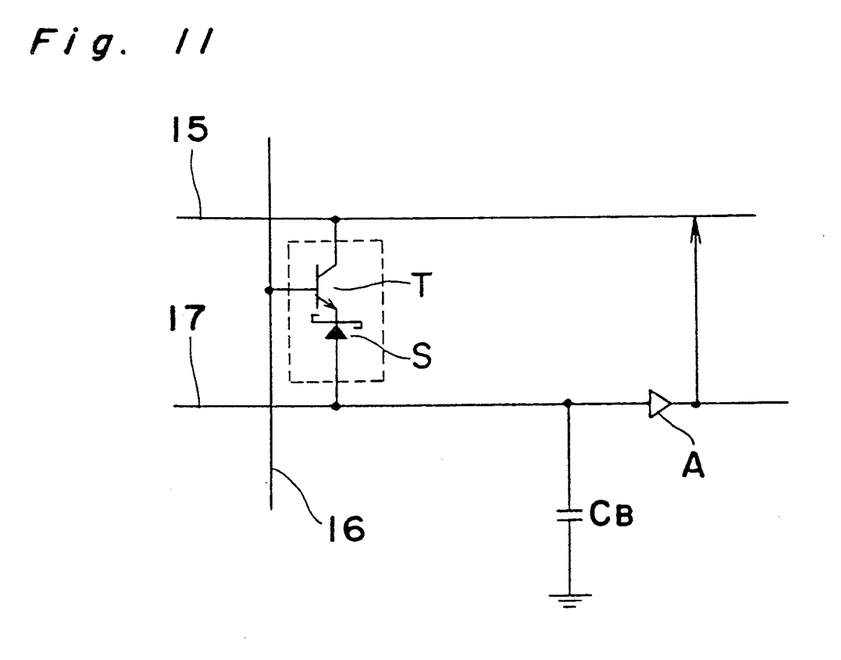
FIG. 11 is an equivalent circuit diagram of a memory cell shown in FIG. 7.

FIG. 11 shows an equivalent circuit of a cell of a semiconductor device explained above. That is, a memory cell of Example 1 can be considered as a series connection of an npn transistor T and a Schottky diode S using the Schottky contact of an npn transistor.

When reading information, the word line 16 is changed to a low-level so that the charges $Q_s$ stored in the Schottky diode S flow over the Schottky barrier to the data line 17. Then, the charges stored in the data line capacitance $C_B$ and the charges $Q_s$ of the memory cell are redistributed to change the electrical potential of the data line. Such a change in the electrical voltage of the data line 17 is amplified by a sense amplifier A for providing an output. Because the storage charges $Q_s$ in the Schottky diode S of the memory cell vanish, the signal amplified by the sense amplifier A is fed back to the bit line 16 for conducting a re-write in the memory cell to keep the memory information.

Figure 12A:
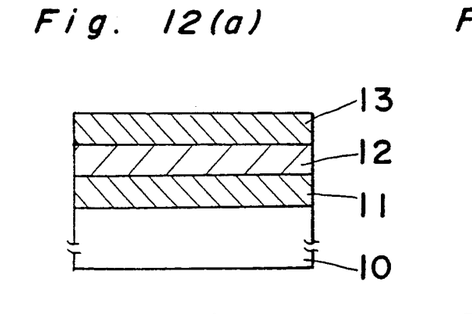
Figure 12B:
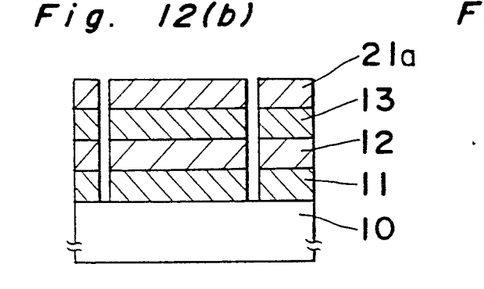
Figure 12C:
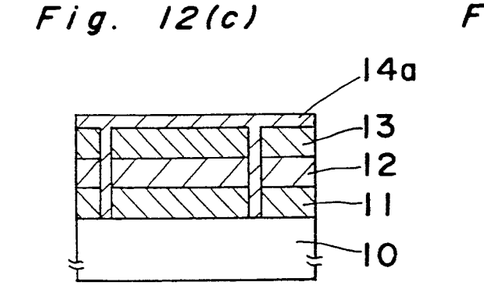

A method for manufacturing a semiconductor device of Example 1 will be explained below with reference to FIGS. 12(a)-12(n). As shown in FIG. 12(a), a first n-type semiconductor region 11, a p-type semiconductor region 12 and a second n-type semiconductor region 13 are formed on a silicon substrate 10 using ion implantation and annealing. Then, as shown in FIG. 12(b), by performing dry etching using a mask of a resist 21a formed with photolithography, the three regions 11, 12 and 13 are etched into the substrate 10 to form cells. Then, the resist 21a is removed, and an insulating film 14a is formed for separating the cells as shown in FIG. 12(c).

Figure 12D:
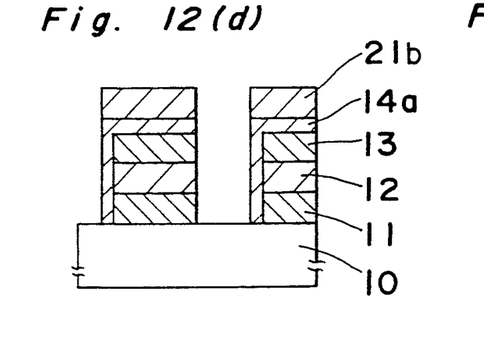
Figure 12E:
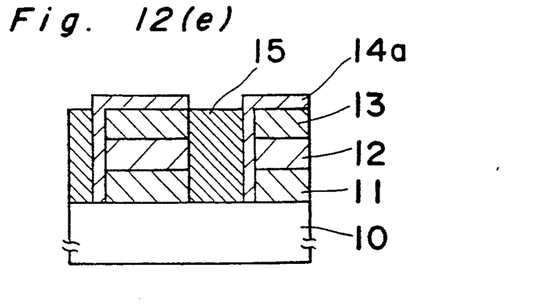
Figure 12F:
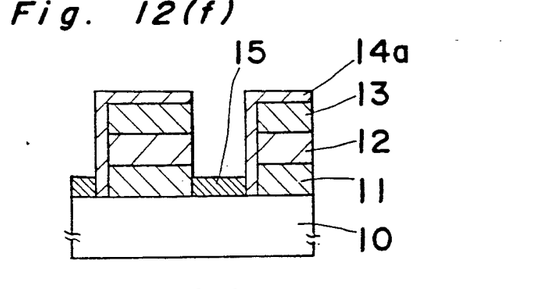

Next, by performing dry etching using a mask of resist 21b formed by photolithography, the three layers 11, 12 and 13 are again etched into the substrate 10, as shown in FIG. 12(d), and tungsten for the bit lines 15 is deposited selectively only up to the second n-type semiconductor region 13, as shown in FIG. 12(e). Then, the tungsten is etched selectively down to a position below the interface between the first n-type and the p-type semiconductor regions 11, 12, as shown in FIG. 12(f).

Figure 12G:
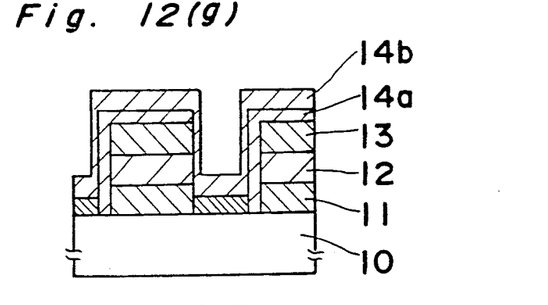
Figure 12H:
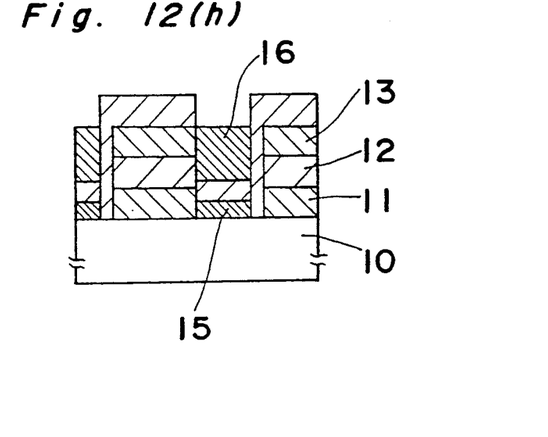
Figure 12I:
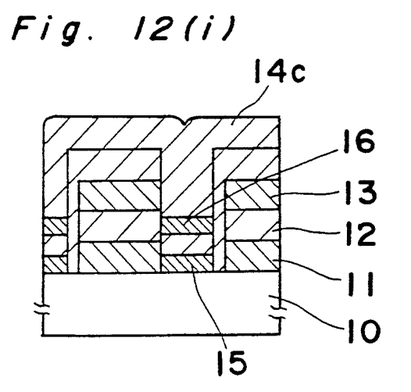
Figure 12J:
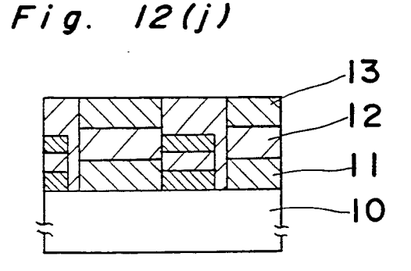

Then, an insulating film 14b is deposited over the entire surface, as shown in FIG. 12(g). Next, the insulating film 14b is etched over the entire surface until the second n-type semiconductor region 13 and a part of the p-type semiconductor region 12 are exposed, and tungsten is deposited selectively on the exposed silicon plane to form word lines 16, as shown in FIG. 12(h). Then, an insulating film 14c is formed on the entire surface, as shown in FIG. 12(i). Further, the insulating films 14a and 14c are etched until the second n-type semiconductor region 13 emerges, as shown in FIG. 12(j).

Figure 12K:
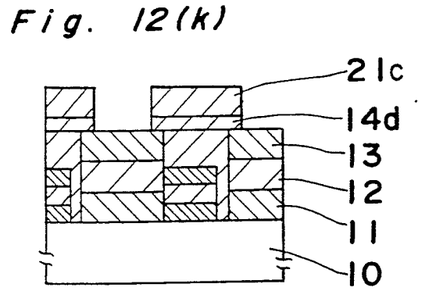

Next, after an insulating film 14d is formed on the entire surface, dry etching is performed using a mask of a resist 21c made by photolithography in order to make openings for a part of the second n-type semiconductor region 13 as shown in FIG. 12(k). Then, the mask is removed.

Figure 12L:
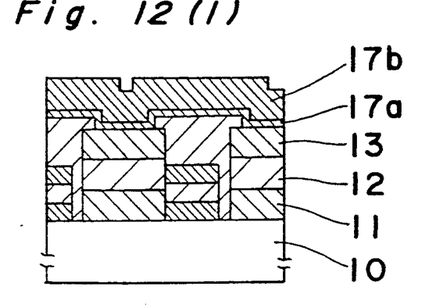
Figure 12M:
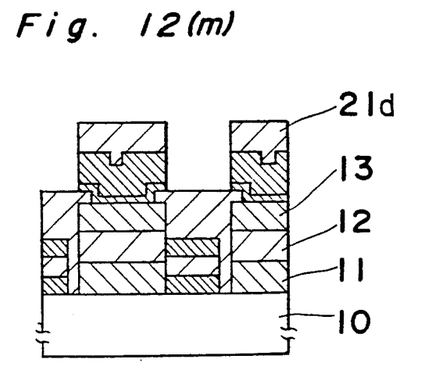

Next, a metal 17a such as gold which can make a Schottky contact with the second n-type semiconductor region 13 and aluminum 17b having good electrical conductivity are deposited successively, for data lines as shown in FIG. 12(l). Further, the dry etching of the metals 17a and 17b is performed using a mask of resist 21d formed by photolithography, as shown in FIG. 12(m), and the resist 21d is removed.

Figure 12N:
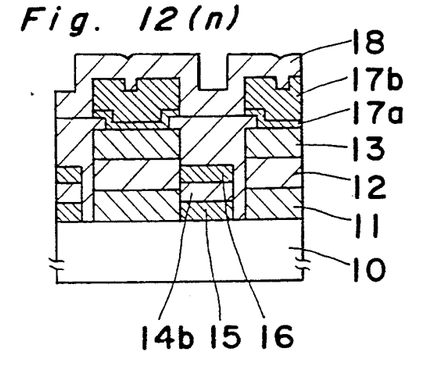

Then, a protection film 18 is formed on the entire surface as shown in FIG. 12(n) to complete a semiconductor device according to the present invention.

Figure 13:
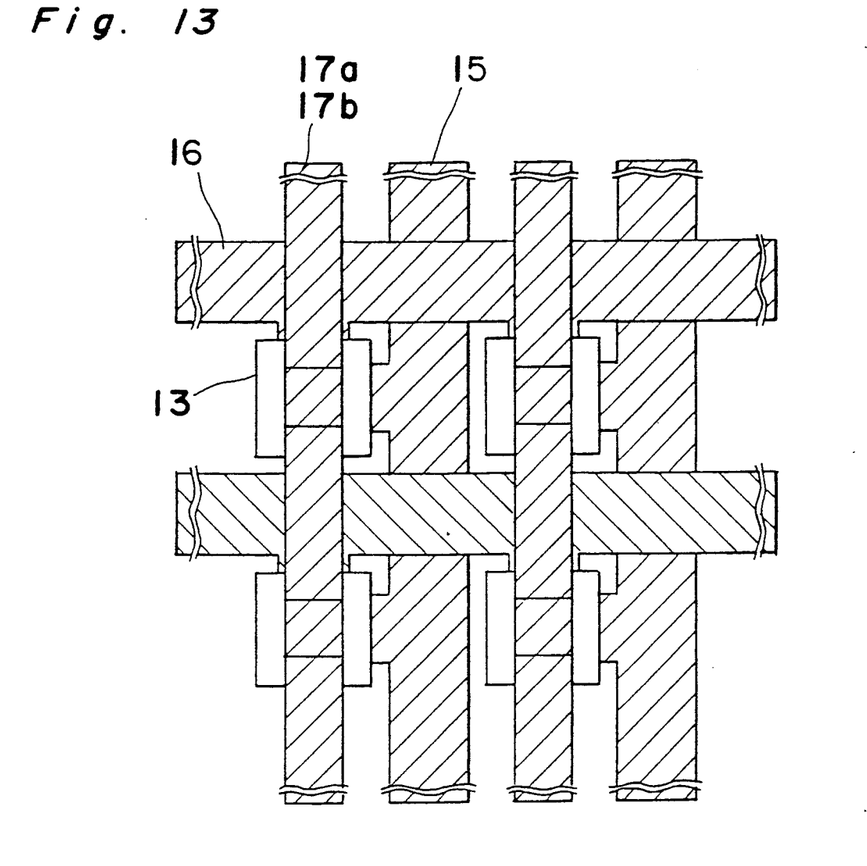
FIG. 13 is a schematic plan view of a cell shown in FIG. 7.

FIG. 13 shows a plan view of the semiconductor device manufactured as explained above.

FIGS. 12(a)-12(n) and FIG. 13 show that the semiconductor device has a simple structure of metallization.

Figure 14A:
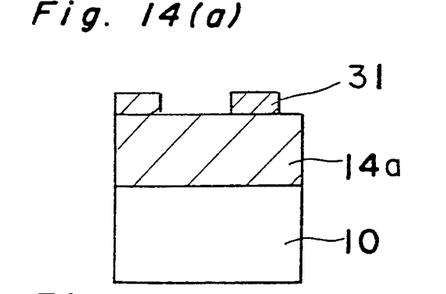
Figure 14B:
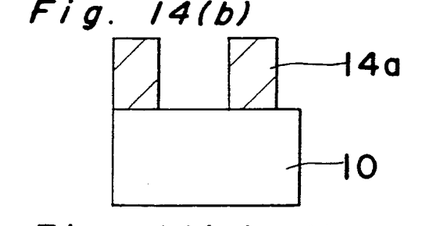
Figure 14C:
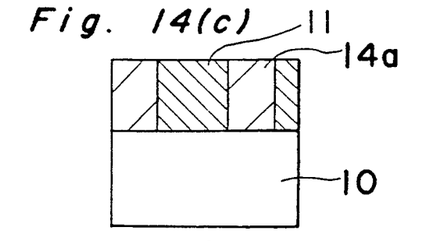
Figure 14D:
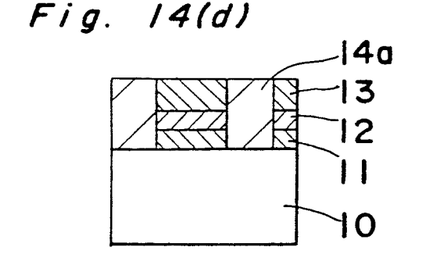

FIG. 14(a)-14(i) shows another method for manufacturing a semiconductor device of Example 1. First, an insulating film 14a is formed on a silicon substrate 10, and a mask of the isolation regions is formed with a resist 31 formed on the insulating film 14a, as shown in FIG. 14(a). Next, etching of the insulating film 14a except the separation regions is performed as shown in FIG. 14(b). Then, an n-type semiconductor region 11 is formed in the part except the separation regions 11 with epitaxial growth, as shown in FIG. 14(c). Next, ion implantation and annealing of the n-type semiconductor region 14a are performed in the direction of depth to form a p-type semiconductor region 12 and a second semiconductor region 13, as shown in FIG. 14(d).

Figure 14E:
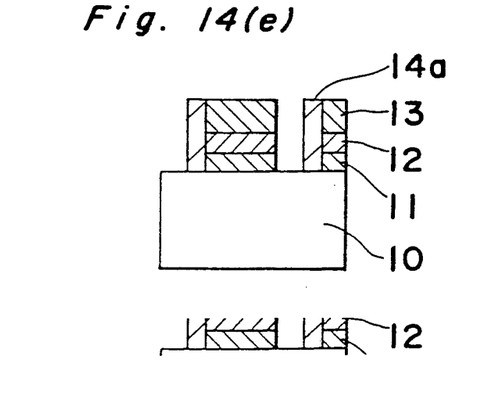
Figure 14F:
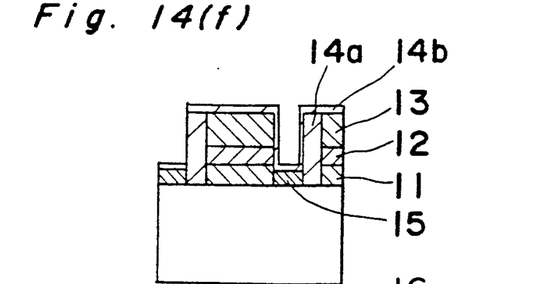

Then, as shown in FIG. 14(e), the etching of a part of the insulation film 14a is performed until the substrate 10. Next, tungsten is formed selectively only on the substrate 10 to form bit lines 15, and the tungsten is etched selectively until a position below the interface between the first n-type and the p-type semiconductor regions 11 and 12. Then, an insulating film 14b is formed on the entire surface, as shown in FIG. 14(f).

Figure 14G:
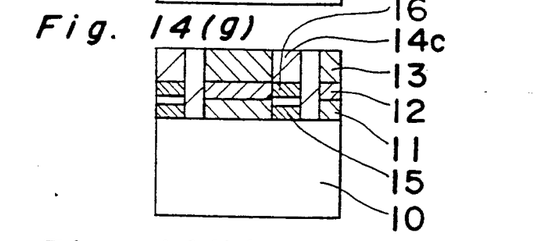

Next, the etching of the insulating film 14b is performed until a part of the p-type semiconductor region 12 and the second n-type semiconductor region 13 are exposed, and tungsten is formed selectively on the exposed semiconductor region 12 to form word lines 16. Then, the tungsten is etched selectively to a position below the interface between the p-type and the second n-type semiconductor regions as 12 and 13. Next, an insulating film 14c is formed over the entire surface, and the insulating film 14c is etched until the second n-type semiconductor region 13 emerges, as shown in FIG. 14(g).

Figure 14H:
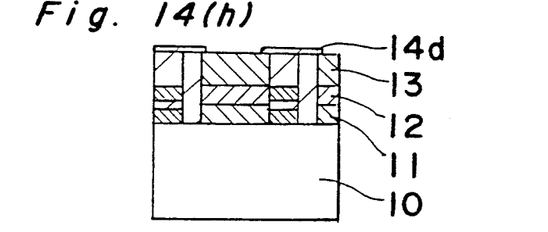
Figure 14I:
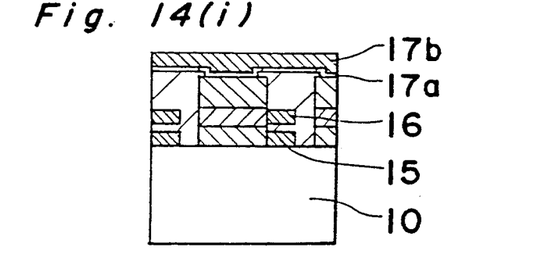
Figure 14J:
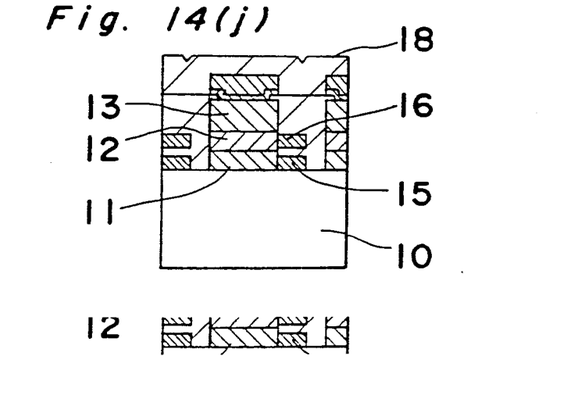

Then, after an insulating film 14d is formed on the entire surface, dry etching of the insulating film 14d is performed using a mask of resist made by photolithography in order to open a part of the second n-type semiconductor region 13, as shown in FIG. 14(h). Next, a metal such as gold which can make Schottky contact with the second n-type semiconductor region 13 and aluminum 17b having a good electrical conductivity are formed for data lines successively, as shown in FIG. 14(i). Then, the dry etching of the metals 17a and 17b are performed using a mask of a resist made by photolithography. Next, a protection film is formed on the entire surface as shown in FIG. 14(j), to complete a semiconductor device of this Example.

In this example of a manufacturing method, deposition films formed with epitaxial growth are used for the first n-type semiconductor region 11, the p-type semiconductor region 12, and the second n-type semiconductor region 13. However, as deposition films, polycrystalline sillicon or hydrogenated amorphous silicon can also be used.

The density of a semiconductor device can be increased in a semiconductor device with memory functions having the structure mentioned above. In a one transistor-one capacitor type DRAM, about $3 \times 10^5$ electrons of storage charges per capacitor area required for a very high density such as 256M bits or 1 G bits as shown in FIG. 5. Because a few $\mu m^2$ of capacitor area is necessary to store the above-mentioned amount of charges while a cell size is about three $\mu m^2$ for a 1 G bit DRAM, it is understood to be difficult to realize such a high density of one transistor-one capacitor type DRAM.

On the contrary, the amount of stored charges of a semiconductor device of this Example is $4 \times 10^5$ when the impurity density of the second n-type semiconductor region 13 as the charge storage region is $5 \times 10^{19}/cm^3$ and the region 13 has $0.2 \times 0.2$ $\mu m^2$ of an area and 0.2 $\mu m$ of depth, as shown in FIGS. 5 and 6. That is, a large amount of charges can be stored in an extremely small size, and a high density of semiconductor device can be manufactured easily. FIG. 6 shows clearly that the area of charge storage region of a semiconductor device according to the present invention can be made small by about two digits when compared with that of a prior art device.

The type of electrical conduction of the intermediate semiconductor region 12 has to be different from that of the neighboring semiconductor regions 11 and 13. Then, a structure of a first p-type semiconductor region 11, and an n-type semiconductor region 12 and a second p-type semiconductor region 13 can also be used, or the electrical conduction type can be reversed from that explained above.

EXAMPLE 2

Figure 15:
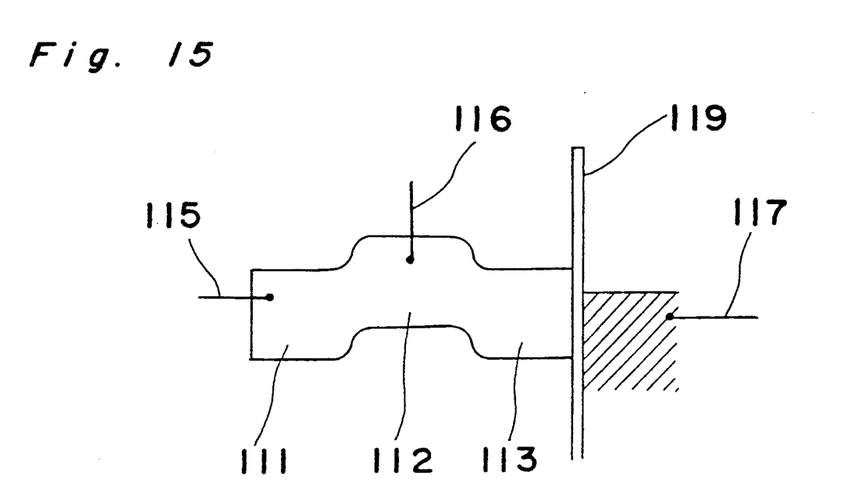
FIG. 15 is a diagram of band structure of a memory cell of a second example.
Figure 16:
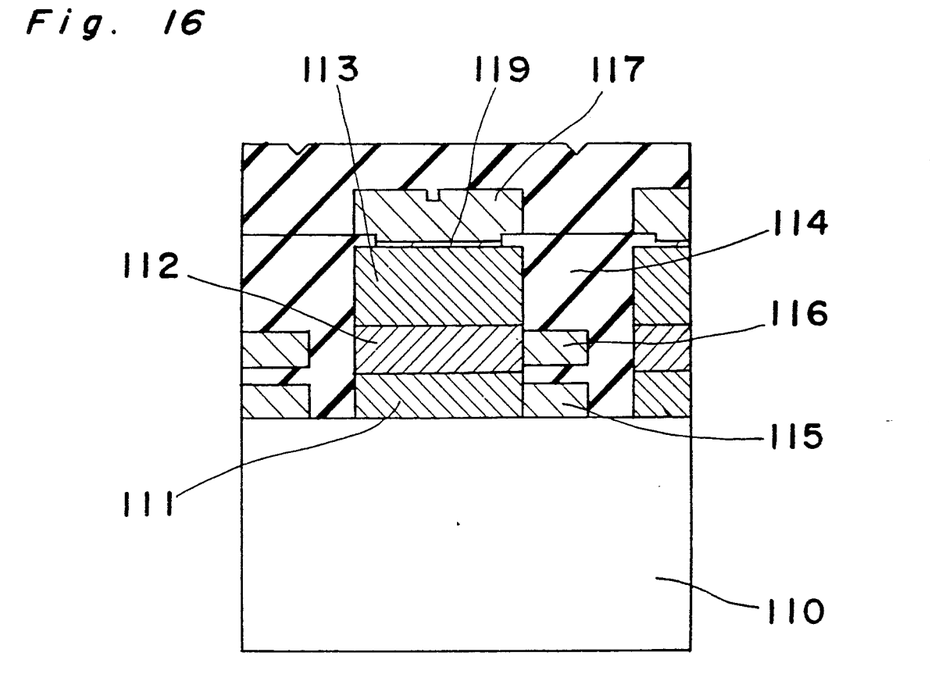
FIG. 16 is a schematic sectional view of a memory cell of a second example.

FIG. 15 shows a band diagram and FIG. 16 shows a sectional view of a second example of a semiconductor device according to the present invention. This structure displayed in FIG. 16 is different from that of Example 1 shown in FIG. 7 only in that a thin insulating film 119 of, for example, a few tenth μm thickness through which a tunnel current can flow is interposed between the second n-type semiconductor region 113 and the data line 117 instead of a Schottky contact interface. In other words, a first n-type semiconductor region 111, a p-type semiconductor region 112 and a second n-type semiconductor 113 are formed successively on a silicon substrate 110 to form a cell, and each cell is separated from the others with an insulating film 114. The first n-type semiconductor region 111 and the p-type semiconductor region 112 are connected to a bit line 115 for writing information and to a word line 116 for controlling information, respectively, while the third semiconductor region 113 is connected through the thin insulating film 119 to a data line 117 for reading information. As shown in FIG. 15, charges can be stored in the second n-type semiconductor region 113 between the insulating film 119 and the pn junction at the interface between the p-type and the second n-type semiconductor regions 112 and 113. The insulating film 119 plays a similar role to that of the Schotkey barrier in Example 1. The manufacturing method of the second example is almost the same as that shown in FIGS. 12(a)–12(n), while being different only in that the surface of the second n-type semiconductor region 113 is oxidized slightly just before forming a data line 117 to form an insulating film for tunneling in a step in correspondence with FIG. 12(l).

EXAMPLE 3

Figure 17:
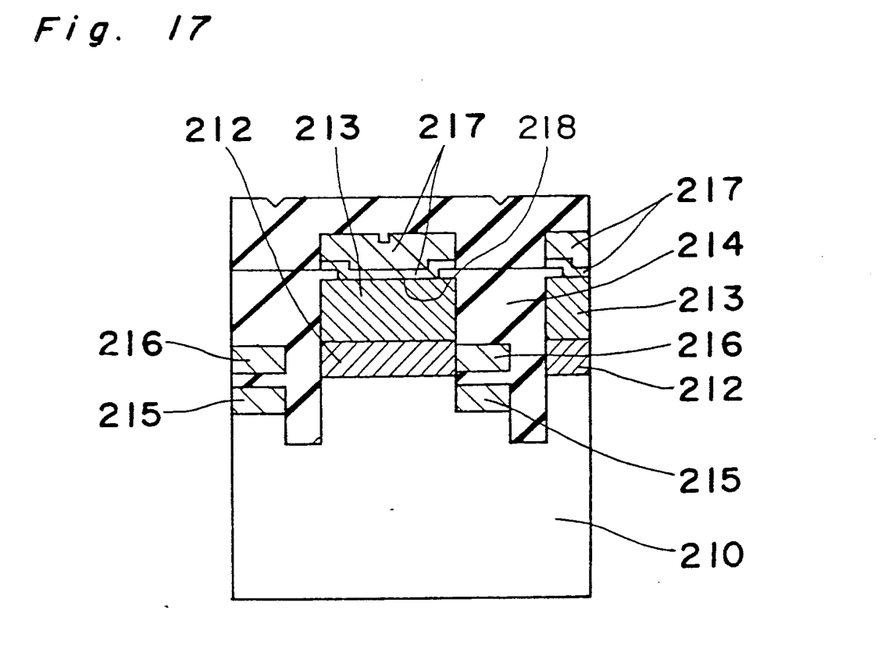
FIG. 17 is a schematic sectional view of a memory cell of a third example.

FIG. 17 shows a sectional view of a third example of a cell of a semiconductor device having memory function. This device is characterized in that a substrate 210 is used as the first semiconductor region 11. A p-type semiconductor region 212 and an n-type semiconductor region 213 is formed successively on the semiconductor substrate 210. A bit line 215 for writing information is connected electrically to the semiconductor substrate 210 near the p-type semiconductor region 212, while a word line 216 is connected electrically to the p-type semiconductor region 212. Further, a data line 217 is connected through a Schottky barrier 218 to the n-type semiconductor region 213, as in the device of Example 1.

Figure 18A:
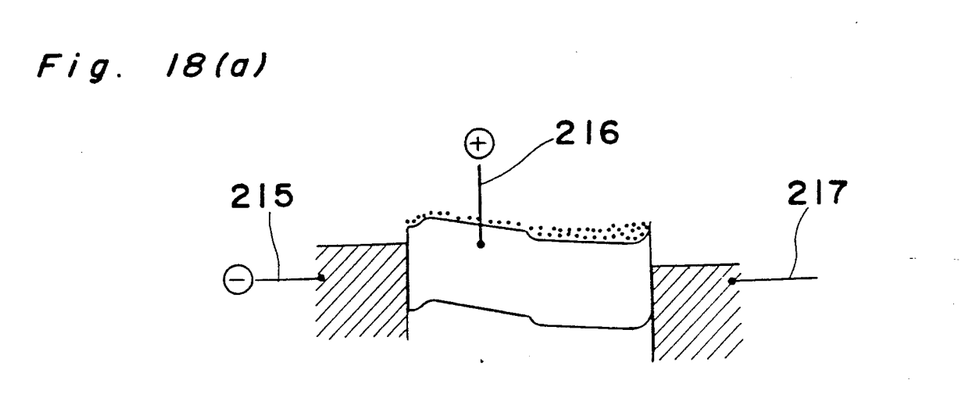
Figure 18B:
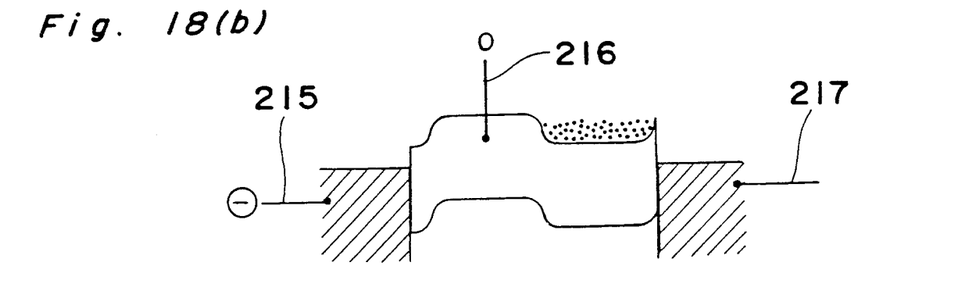
Figure 18C:
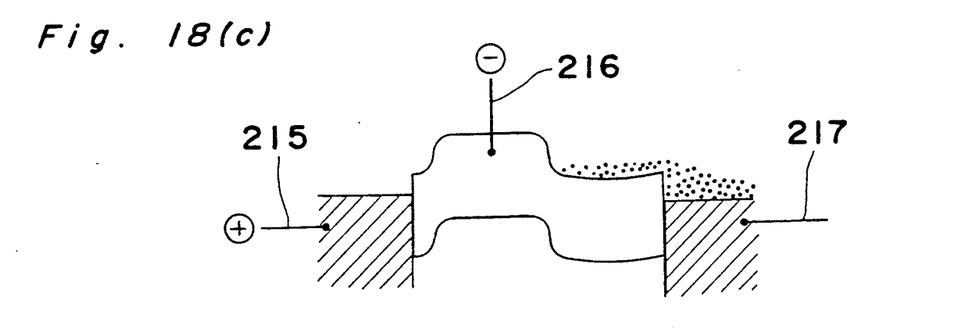

The memory function of a semiconductor device of this Example will be explained below with reference to the band diagrams of FIGS. 18(a)–18(c). In a write state shown in FIG. 18(a), a negative electrical voltage is applied to the bit line 215, while a positive electrical voltage is applied to the word line 216. Thus, information charges move from the semiconductor substrate 210 to the n-type semiconductor region 213. In a hold state shown in FIG. 18(b), a negative electrical voltage smaller than that applied in FIG. 18(a) is applied to the bit line 215, while no electrical voltage is applied to the word line 216. Then the information charges are stored in the n-type semiconductor region 213 between the pn junction at the interface with the p-type semiconductor region 212 and the Schottky barrier 218 at the interface with the data line 217. In a read state shown in FIG. 18(c), a positive electrical voltage is applied to the bit line 215, while a negative electrical voltage is applied to the word line 216. Then, the information charges flow over the Schottky barrier 218 to the data line 217. Thus, the functions of writing, holding and reading of information is performed, similarly to those of Example 1.

It should be noted that the first semiconductor region 111 in the second example shown in FIG. 15 can also be replaced by the substrate 110 in a fashion similar to the structure shown in FIG. 16.

EXAMPLE 4

Figure 19:
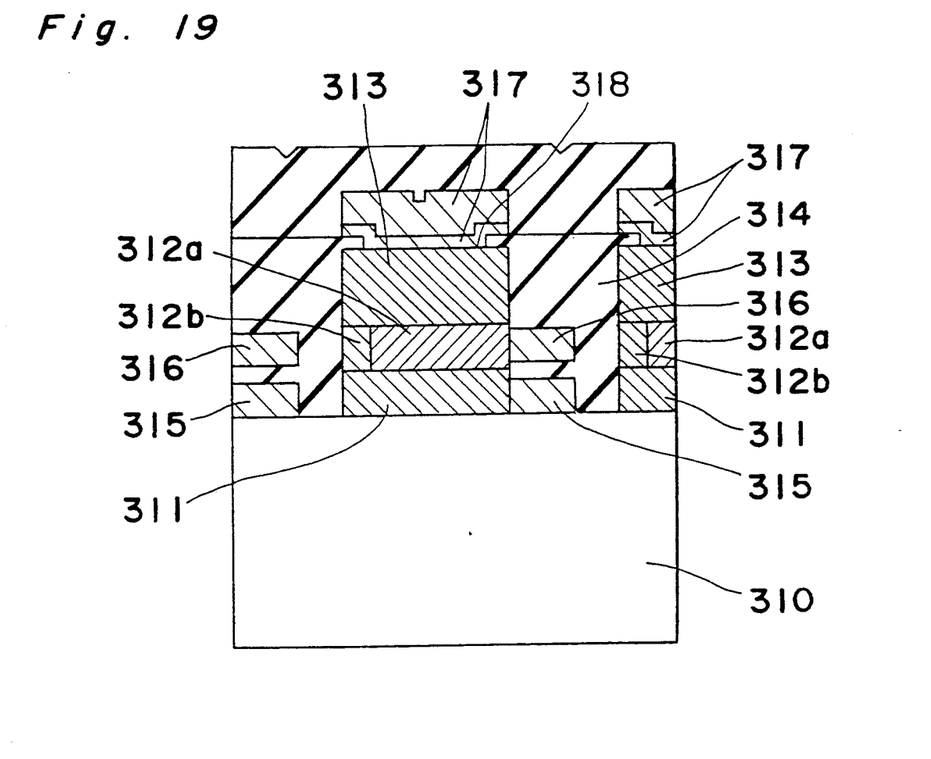
FIG. 19 is a schematic sectional view of a memory cell of a fourth example.

FIG. 19 shows a sectional view of a fourth example of a semiconductor device according to the present invention.

This device is characterized in that a region in correspondence with the second semiconductor region 12 of Example 1 shown in FIG. 7 is composed of two regions: a second region connected a word line for controlling information charges and a fourth region for transmitting charges, the fourth region having a type of electrical conductivity different from that of the second region. Thus, the switching transistor of a memory cell is a junction field effect transistor.

In FIG. 19, a first n-type semiconductor region 311 is formed on a semiconductor substrate 310. Then, a gate region 312a of p-type semiconductor and a channel region 312b of n-type semiconductor are formed in parallel on the first n-type semiconductor region 311. Then, a second n-type semiconductor region 313 is applied to the gate region 312 and the channel region 312b of n-type semiconductor. A cell includes these regions 311, 312a, 313 and 312b, and each cell is separated from the others by an insulating film 314. A bit line 315 and a word line 316 are connected electrically to the first n-type semiconductor region 311 and to the gate region 312a, respectively, while a data line 317 is connected to the second n-type semiconductor region 313 via a Schottky contact interface 318.

Figure 20A:
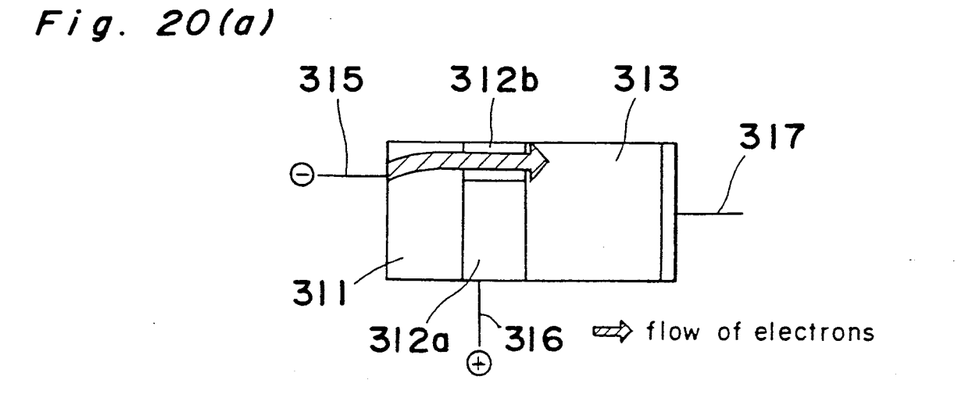
Figure 20B:
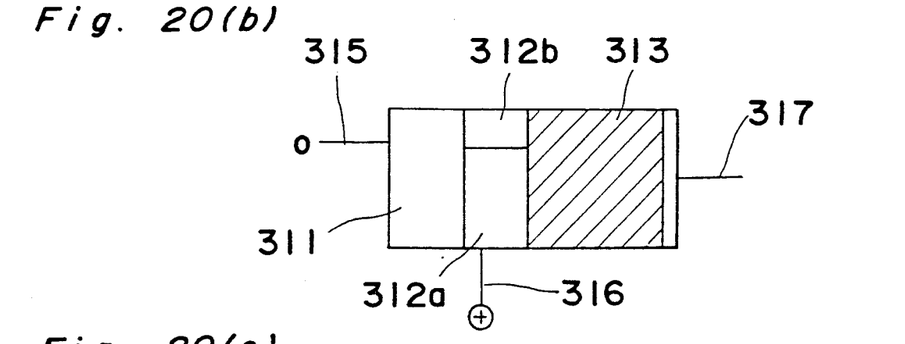
Figure 20C:
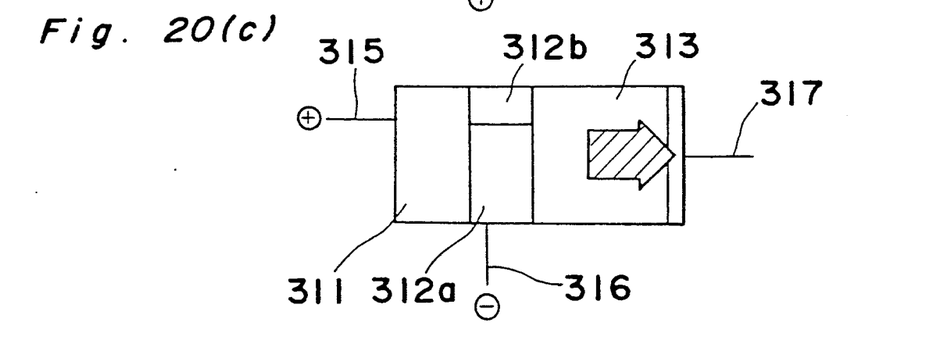

The memory function of this example will be explained below with reference to FIGS. 20(a)–20(c). In a write state shown in FIG. 20(a), a negative electrical voltage and a positive electrical voltage are applied to the bit line 315 and to the word line 316, respectively. Thus, the gate region 312 is turned on, so that electrons are injected from the bit line 315 and flow through the channel region 312b into the second n-type semiconductor region 313. In a hold state shown in FIG. 20(b), no electrical voltage is applied to the bit line 315, while a positive electrical voltage is applied to the word line 316. The electrons flowing into the second n-type region 313 is stored in the region 313. In a read state shown in FIG. 20(c), a positive electrical voltage and a negative electrical voltage are applied to the bit line 315 and to the word line 316. Then, the electrons stored in the second n-type electric voltage flows to the data line 317.

Figure 21:
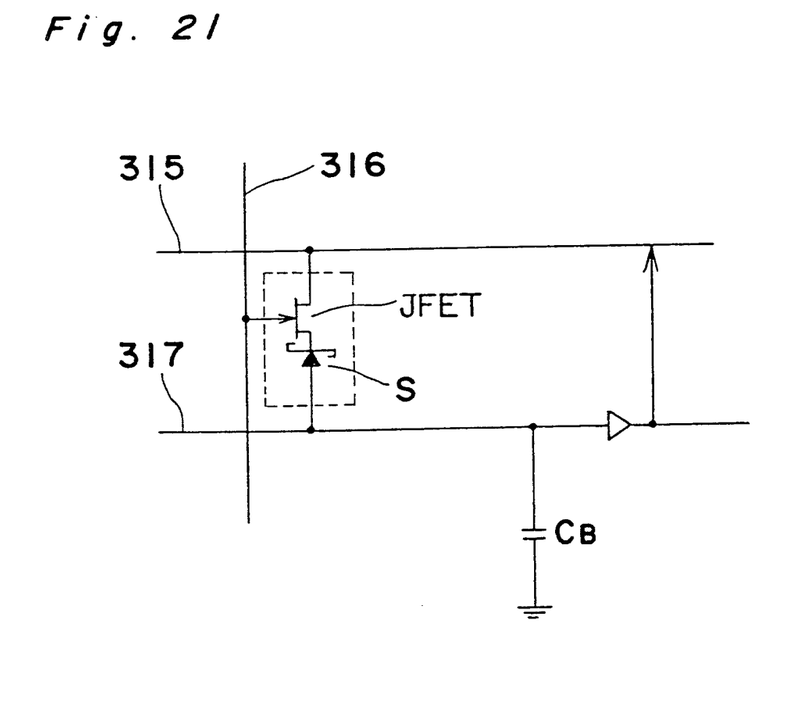
FIG. 21 is an equivalent circuit diagram of a memory cell of a fourth example.

As shown in FIG. 21, an equivalent circuit of a cell of a semiconductor device of this Example, can be considered as a series connection of a junction field effect transistor (JFET) and a Schottky diode (S). The basic memory function of this cell is performed in a fashion similar to that of Example 1.

As explained above, the memory function can be performed more reliably than that of Example 1.

It is also possible that in the second example having a tunnel barrier instead of Schottky barrier, shown in FIG. 15, the p-type semiconductor region 112 is composed of a gate region and a channel region, both regions having an electrical conductivity type different from each other, so as to have a junction field effect transistor as the switching transistor.

It is understood that various other modifications will be apparent to and can be readily made by those skilled in the art without departing from the scope and spirit of the present invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the present invention pertains.

What is claimed is:

1. A semiconductor memory device comprising:
   a first semiconductor region connected to a bit line for suppling signal charges;
   a second semiconductor region connected to said first semiconductor region to form a pn junction and to a word line for controlling said signal charges, wherein said second semiconductor region has a type of electrical conductivity which is different from that of said first semiconductor region; and
   a third semiconductor region connected to said second semiconductor region to form a pn junction and to a data line for reading said signal charges, wherein said third semiconductor region has a type of electrical conductivity which is the same as that of said first semiconductor region, and wherein said third semiconductor region has a barrier at the interface with said data line, and wherein said height of said barrier is controlled by voltages applied by said bit and word lines and said signal charges are stored in said third semiconductor area or said signal charges stored in said third semiconductor region are transferred to said data line according to said height of said barrier.

2. A semiconductor memory device according to claim 1, wherein said barrier is a Schottky barrier.

3. A semiconductor memory device according to claim 2, wherein said first semiconductor region is a semiconductor substrate.

4. A semiconductor memory device according to claim 2, wherein said first, second and third semiconductor regions are made of deposited films.

5. A semiconductor memory device according to claim 1, wherein said barrier is a thin insulating layer through which a tunnel current can flow.

6. A semiconductor memory device according to claim 5, wherein said first semiconductor region is a substrate.

7. A semiconductor memory device according to claim 5, wherein said first semiconductor region is a substrate of said second semiconductor region.

8. A semiconductor memory device comprising:
   a first semiconductor region connected to a bit line for supplying signal charges;
   a second semiconductor region connected to said first semiconductor region to form a pn junction and to a word line for controlling said signal charges, wherein said second semiconductor region has a type of electrical conductivity which is different from that of said first semiconductor region; and
   a third semiconductor region connected to said second semiconductor region to form a pn junction and to a data line for reading said signal charges, wherein said third semiconductor region has a type of electrical conductivity which is the same as that of said first semiconductor region, and wherein said third semiconductor region has a barrier at the interface with said data line, and wherein said height of said barrier is controlled by voltages applied by said bit and word lines and said signal charges are stored in said third semiconductor area or said signal charges stored in said third semiconductor region are transferred to said data line according to said height of said barrier; and
   a fourth semiconductor region electrically connected to said first semiconductor region and electrically connected to the third semiconductor region to said second semiconductor region to form a pn junction, wherein said fourth semiconductor region has a type of electrical conductivity which is the same as that of the first semiconductor region.

9. A semiconductor memory device according to claim 8, wherein said barrier is a Schottky barrier.

10. A semiconductor memory device according to claim 8, wherein said first semiconductor region is a semiconductor substrate.

11. A semiconductor memory device according to claim 9, wherein said first, second, third and fourth semiconductor regions are made of deposited films.

12. A semiconductor memory device according to claim 8, wherein said barrier is a thin insulating layer through which a tunnel current can flow.

13. A semiconductor memory device according to claim 9, wherein said first semiconductor region is a substrate.

14. A semiconductor memory device according to claim 12, wherein said first semiconductor region is a substrate.

* * * * *